United States Patent
Spella et al.

(10) Patent No.: US 9,515,368 B2
(45) Date of Patent: Dec. 6, 2016

(54) TRANSMISSION LINE INTERCONNECT

(71) Applicant: NXP B.V., Eindhoven (NL)

(72) Inventors: Maristella Spella, Tilburg (NL); Raf Lodewijk Jan Roovers, Wommelgem (BE)

(73) Assignee: NXP B.V., Eindhoven (NL)

( * ) Notice: Subject to any disclaimer, the term of this patent is extended or adjusted under 35 U.S.C. 154(b) by 289 days.

(21) Appl. No.: 14/205,029

(22) Filed: Mar. 11, 2014

(65) Prior Publication Data

US 2015/0263403 A1  Sep. 17, 2015

(51) Int. Cl.
| | |
|---|---|
| *H01P 5/107* | (2006.01) |
| *H01P 5/08* | (2006.01) |
| *H01L 23/66* | (2006.01) |
| *H01Q 1/22* | (2006.01) |
| *H01P 11/00* | (2006.01) |
| *H01Q 1/50* | (2006.01) |
| *G02B 6/42* | (2006.01) |
| *H01L 23/00* | (2006.01) |
| *H01P 5/00* | (2006.01) |

(52) U.S. Cl.
CPC ............... *H01P 5/08* (2013.01); *G02B 6/4201* (2013.01); *H01L 23/66* (2013.01); *H01L 24/19* (2013.01); *H01P 11/00* (2013.01); *H01Q 1/2283* (2013.01); *H01Q 1/50* (2013.01); H01L 2223/6627 (2013.01); H01L 2223/6655 (2013.01); H01L 2223/6677 (2013.01); H01L 2224/12105 (2013.01); H01L 2224/14 (2013.01); H01L 2224/24137 (2013.01); H01L 2924/1815 (2013.01); *Y10T 29/49016* (2015.01); *Y10T 29/49018* (2015.01)

(58) Field of Classification Search
CPC ............... H01P 5/02; H01P 5/08; H01P 5/087; H01P 5/028
USPC ........................................ 333/24 R, 254, 260
See application file for complete search history.

(56) References Cited

U.S. PATENT DOCUMENTS

| | | | | |
|---|---|---|---|---|
| 6,242,984 B1 * | 6/2001 | Stones | ..................... | H01P 5/107 330/295 |
| 6,967,347 B2 * | 11/2005 | Estes | ..................... | B82Y 10/00 257/25 |

(Continued)

OTHER PUBLICATIONS

Dolatsha, N. et al. "Dielectric Waveguide with Planar Multi-Mode Excitation for High Data-Rate Chip-to-Chip Interconnects", IEEE Intl. Conf. on Ultra-Wideband, 184,188 pgs. (Sep. 2013).

(Continued)

*Primary Examiner* — Dean Takaoka
(74) *Attorney, Agent, or Firm* — Rajeev Madnawat

(57) ABSTRACT

One example discloses a transmission line interconnect, comprising: an antenna coupling surface; a transmission line coupling surface; and a dielectric molding compound electromagnetically coupling the antenna coupling surface to the transmission line coupling surface. Another example discloses a method of manufacture, for a transmission line interconnect, comprising: forming a dielectric molding compound; defining an antenna coupling surface on the dielectric molding compound; and defining a transmission line coupling surface on the dielectric molding compound whereby millimeter wave frequencies received at the antenna coupling surface are electromagnetically coupled to the transmission line coupling surface.

18 Claims, 18 Drawing Sheets

(56) References Cited

U.S. PATENT DOCUMENTS

| | | | |
|---|---|---|---|
| 7,680,464 B2* | 3/2010 | Pleva | H01P 5/107 333/208 |
| 2008/0119135 A1* | 5/2008 | Washiro | H04B 5/0012 455/41.1 |
| 2009/0009408 A1* | 1/2009 | Rofougaran | H01L 23/66 343/702 |
| 2011/0165839 A1* | 7/2011 | Kawamura | G01S 7/032 455/41.1 |
| 2011/0267153 A1 | 11/2011 | Hirota et al. | |
| 2012/0068890 A1 | 3/2012 | Haroun et al. | |
| 2013/0265734 A1 | 10/2013 | Herbsommer et al. | |
| 2013/0314182 A1* | 11/2013 | Takeda | H01P 3/16 333/24 R |

OTHER PUBLICATIONS

Extended European Search Report for Patent Appln. No. 15158300.2 (Jul. 30, 2015).

Fukuda, Satoshi, et al.; "A 12.5+12.5 Gb/s Full-Duplex Plastic Waveguide Interconnect"; IEEE Journal of Solid-State Circuits, vol. 46, No. 12; 13 pages. (Dec. 2011).

Tanaka, Yusuke, et al; "A Versatile Multi-Modality Serial Link"; IEEE International Solid-State Circuits Conference—ISSCC 2012/ Session 19, 20+ Gb/s Wireline Transceivers & Injection-Locked Clocking; 3 pages (2012).

Tytgat, Maarten, et al.; "A plastic waveguide receiver in 40nm CMOS with on-chip bondwire antenna"; Proceedings of the ESSCIRC; Sep. 16-20, 2013; pp. 335-338 (2013).

* cited by examiner

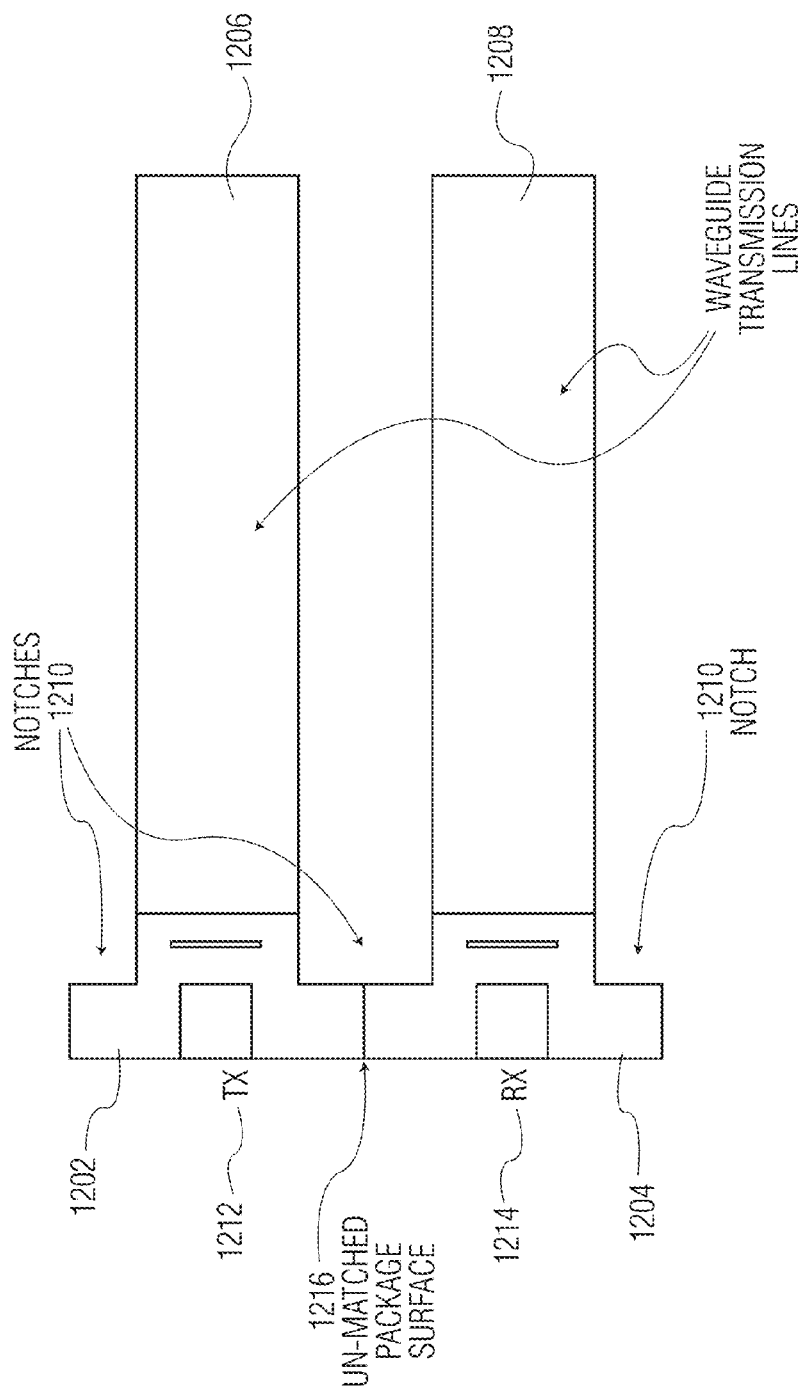

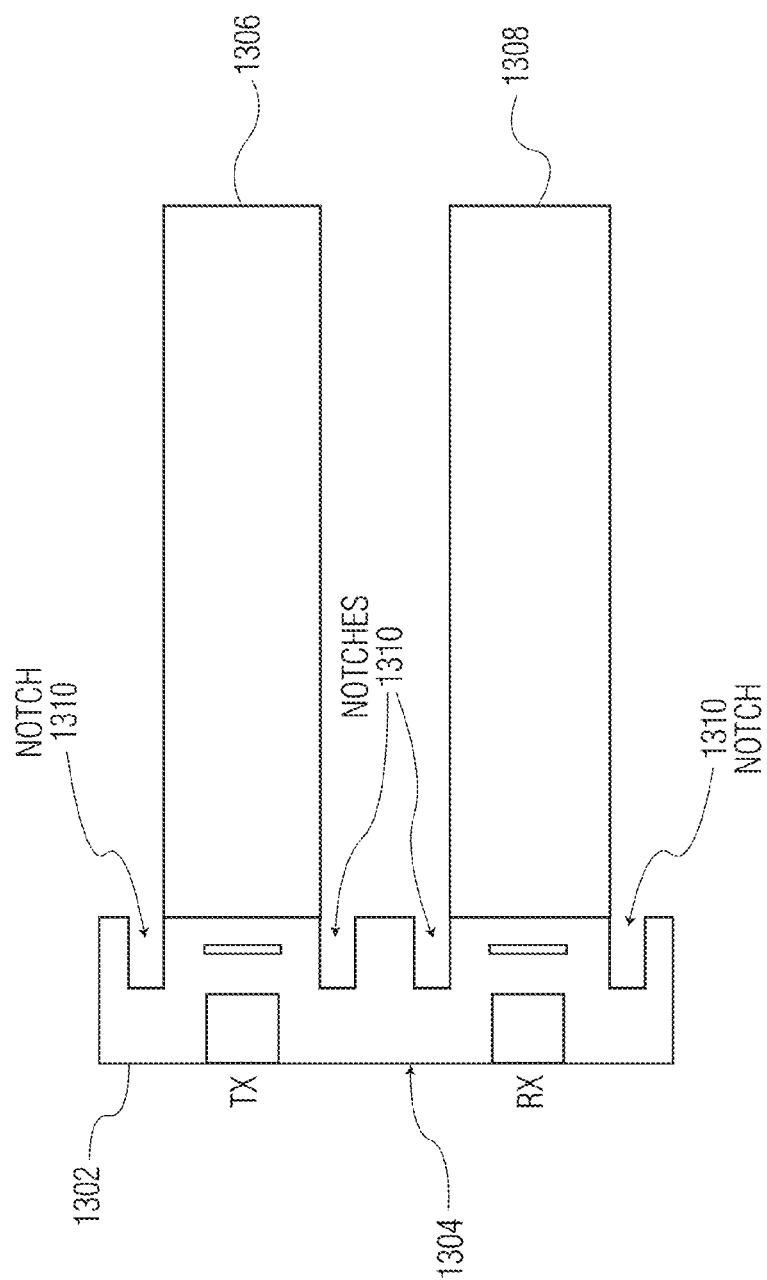

TRANSMISSION LINE INTERCONNECT

BACKGROUND

Brief Background Introduction

This specification relates generally to systems and methods for coupling signals and in one example to a transmission line interconnect.

BRIEF DESCRIPTION OF THE DRAWINGS

FIG. 12A is one example of a top view of a set of transmission line interconnects coupled to transmission lines and including a first set of notches.

FIG. 13A is one example of a top view of a set of transmission line interconnects coupled to transmission lines and including a second set of notches.

Figure 1:
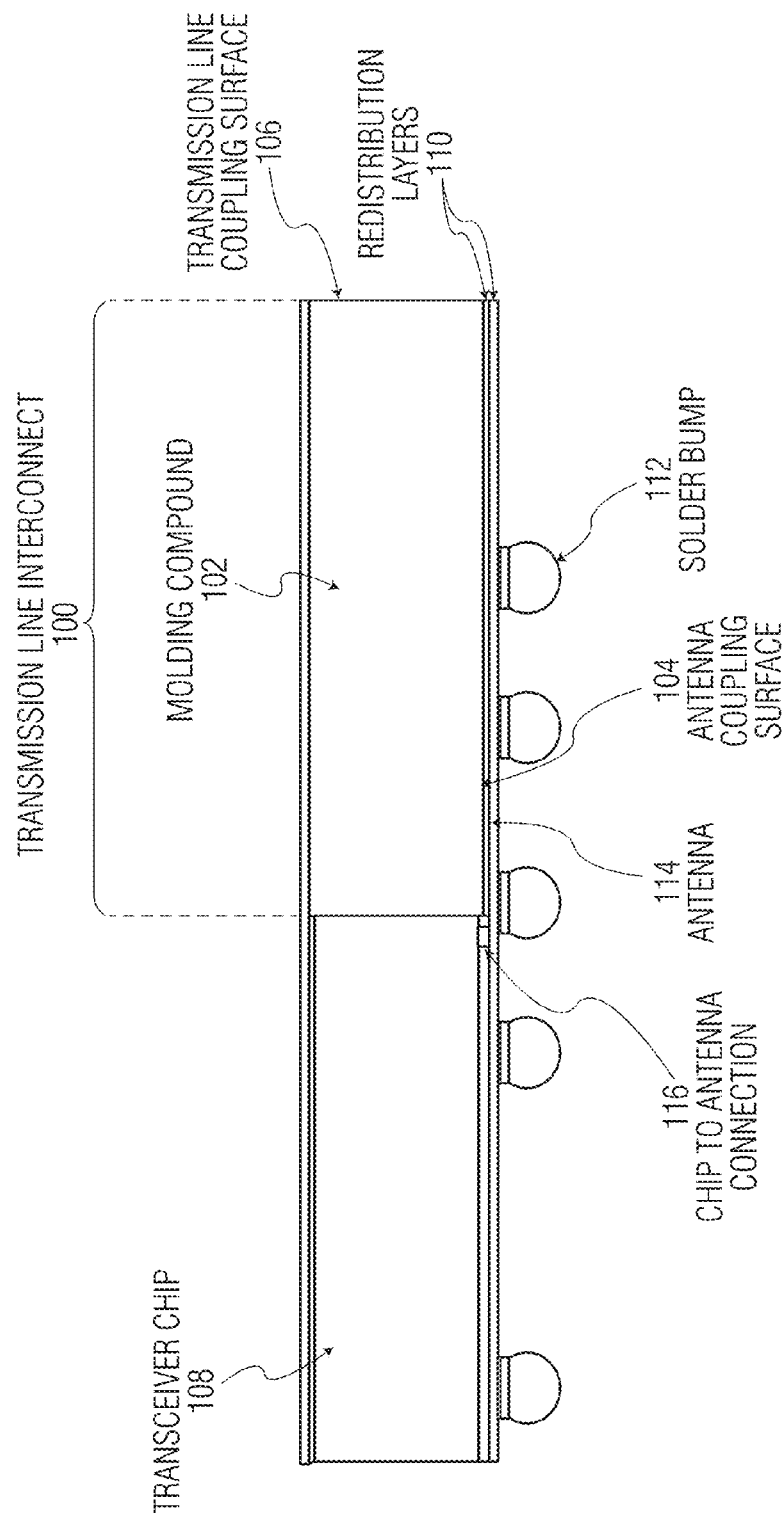
FIG. 1 is one example of a side view of a transmission line interconnect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

High-speed and low-cost interconnects solutions at millimeter-waves (e.g. 30-300 GHz) frequencies require new materials and new connection methods. Plastic waveguides are of lower cost and can efficiently confine electromagnetic waves in the dielectric, eliminating the free space path loss of the wireless connection and the need of electrical-to-optical devices of the fiber optical interconnects.

In one example an interconnect from a chip to a full duplex plastic (dielectric) waveguide includes a transceiver chip mounted on a printed circuit board (PCB) with two Quasi-Yagi antennas as chip-to-waveguide couplers with a plastic waveguide placed on top of the PCB. The chip can be flip-chip mounted to a coplanar strip or wire-bonded to the antennas on PCB.

In another example an interconnect a dipole antenna made with two bond wires and an on-chip reflector. The chip area occupied by the antenna and reflector is over 50% of the total chip area. The chip is connected to the PCB with bond wires that can have high inductance at mm-wave frequencies. A plastic waveguide is placed on top of the bond wire antenna.

Use of bond wires at millimeter-wave (e.g. 30-300 GHz) frequencies however can add to signal loss. A less lossy solution is to connect an antenna directly to a chip. Use of PCB materials can also contribute to signal loss due to a higher dissipation factor of the PCB material, a special mm-wave material is required for the antenna. Also integrating an on-chip antenna reflector can increase costs and size based on the chip area needed for the antenna reflector.

A transmission line interconnect from a transceiver chip to a waveguide transmission line is now presented. In one example the transmission line interconnect is embodied in an embedded wafer level ball grid array (eWLB) package. The eWLB package includes a transceiver chip, an encapsulant (e.g. molding compound) and an antenna in the redistribution layer (RDL). A transmission line, such as a plastic waveguide (e.g. polypropylene), can also be integrated into the eWLB package, or alternatively abutted to an interface surface on the eWLB package.

In one example, the antenna is formed from the RDL and is electromagnetically coupled to the waveguide through the encapsulating mold compound. The antenna in the RDL layer excites one or more resonant modes of the waveguide mode.

The mold compound acts as a dielectric waveguide and induces less signal loss if a dielectric permittivity of the mold compound is as similar to the dielectric permittivity of the plastic waveguide as possible. Matching the interface surface on the eWLB package to that of the waveguide as closely as possible also reduces signal losses. In this example design, the antenna does not require chip area or special PCB materials.

FIG. 1 is one example of a side view of a transmission line interconnect 100. The transmission line interconnect 100 is formed from a dielectric molding compound 102 (aka encapsulant). The molding compound 102 includes an antenna coupling surface 104 and a transmission line coupling surface 106. The dielectric molding compound 102 receives electromagnetic signals at the antenna coupling surface 104 and transmits the electromagnetic signals to the transmission line coupling surface 106. In one example, the transmission line interconnect 100 is coupled to receive and transmit millimeter wave frequencies.

The transmission line interconnect 100 can be packaged in a variety of ways. In one example embodiment the transmission line interconnect 100 is packaged within an embedded Wafer Level Ball Grid Array (eWLB). The eWLB includes a transceiver chip 108 coupled to one or more redistribution layers 110. The redistribution layers 110 include conductive elements which route electrical contact points on the transceiver chip 108 to a set of solder bumps 112. The solder bumps 112, in one example embodiment, are connected to a printed circuit board or another electrical device.

The redistribution layer 110 can also be used to form an antenna 114. The antenna 114 is positioned near the antenna coupling surface 104 of the dielectric molding compound 102. The antenna 114 may be directly coupled to the transceiver chip 108 with a chip to antenna coupler 116.

Electromagnetic coupling performance (e.g. signal losses) of the transmission line interconnect 100 can be adjusted by varying dimensions of the transmission line coupling surface 106, varying a dielectric permittivity of the molding compound 102, and varying a position of the antenna 114 with respect to the antenna coupling surface 104.

Example embodiments of the molding compound 102 can use different encapsulant materials. Epoxy and epoxy blend are one choice for the molding compound 102. Epoxies include organic and inorganic resins, such as used in structural-engineering applications.

Silicone materials are another choice for the molding compound 102. Because silicone resins are silicon rather than carbon-based, they are not considered organic resins, even though some of their processing and curing regimens are similar to organic resins. Silicone resins are of two primary types: solvent-based and room-temperature-vulcanizable (RTV). Curing is accomplished by different mechanisms, depending on the type. RTVs are cured either by exposure to moisture (room humidity) or by catalyst addition. In contrast, solvent-based silicones are most commonly cured thermally after evaporation of the solvent. Silicones are quite flexible over a range of temperatures (from −65° to 150° C.) making them a popular choice for CSPs seeking compliance.

Polyimide is yet another choice for the molding compound 102. Polyimides are used in die-attach adhesive formulations. Polyimide resins have a high-temperature capability, making them acceptable for high-temperature.

Figure 2:
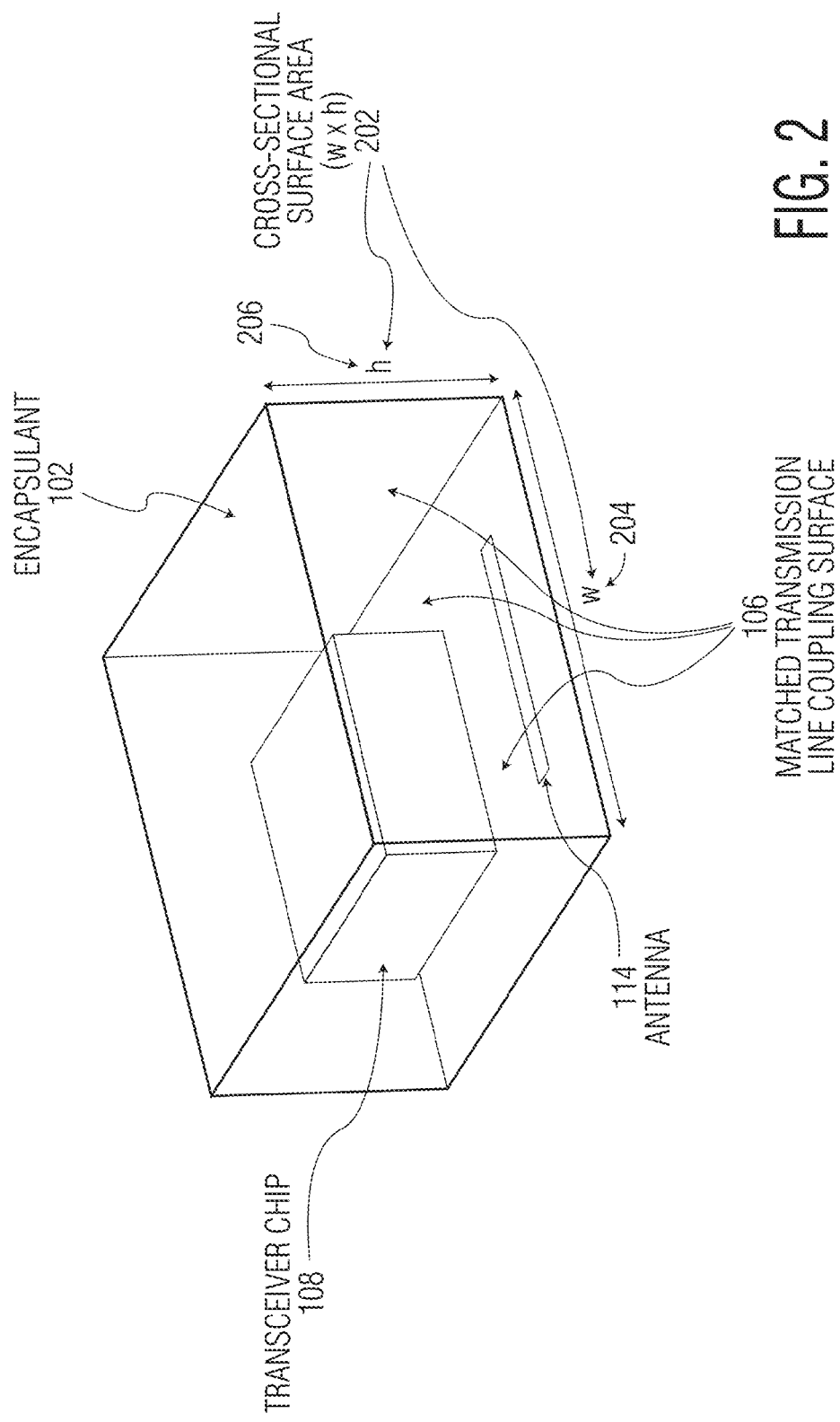
FIG. 2 is one example of a perspective view of a transmission line interconnect.

FIG. 2 is one example of a perspective view of a transmission line interconnect 100. The encapsulant 102 (aka molding compound) is this example extends over the transceiver chip 108. The transmission line coupling surface 106 includes a cross-sectional surface area 202. The cross-sectional surface area 202 in this example is rectangle and includes a width 204 and a height 206.

Figure 3:
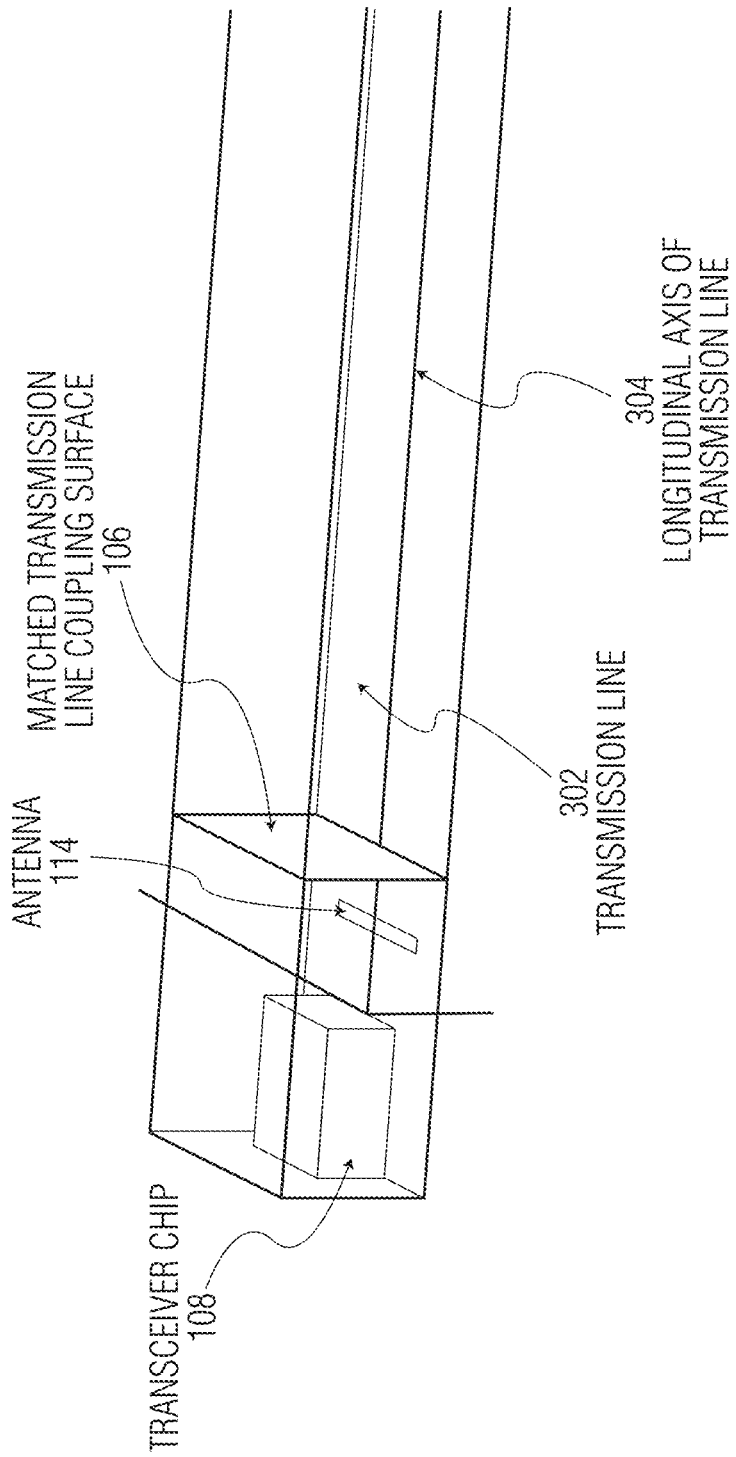
FIG. 3 is one example of a perspective view of a transmission line interconnect coupled to a transmission line.

FIG. 3 is one example of a perspective view of a transmission line interconnect 100 coupled to a transmission line 302. The transmission line interconnect 100 electromagnetically couples the antenna 114 to the transmission line 302 through the transmission line coupling surface 106. In various examples, the transmission line 302 is: a waveguide formed from plastic or another material. The transmission line 302 can either be abutted to the molding compound 102 or a glue or other material may be inserted between the transmission line 302 and the molding compound 102.

In one example the transmission line 302 includes a coupling surface cross-sectional area which is substantially matched to the cross-sectional surface area 202 of the molding compound 102. Substantially is herein defined to include, but not be limited to, embodiments having an exact match plus or minus normal manufacturing tolerances. In one example, the width 204 and height 206 of the cross-sectional surface area 202 is selected such that the interconnect 100 and transmission line 302 assembly will be optimized for exciting a set of resonant electromagnetic modes at a preselected frequency.

In an example embodiment, the transmission line 302 has a first dielectric permittivity and the dielectric molding compound 102 has a second dielectric permittivity which could differ from the first dielectric permittivity if only one guided mode is excited.

In another example, the transmission line 302 is a polypropylene plastic waveguide having a first dielectric permittivity and a mold compound 102 having a dielectric permittivity closer to that of the plastic waveguide permittivity than another mold compound 102 is selected, thereby minimizing signal losses between the transceiver chip 108 and the waveguide. In an example eWLB package the mold compound 102 is an epoxy and the dielectric permittivity is about 3 which is quite close to a dielectric permittivity of polypropylene.

In one example of the transmission line interconnect 100, a cross-sectional area of the transmission line coupling surface 106 is substantially perpendicular to a longitudinal axis 304 of the transmission line 302.

The transmission line interconnect 100 can be embodied in various devices including: a chip to chip or module to module communication device; a USB cable; a coupling between a storage device and a computer; automotive wired and wireless bus architectures; and RF communication devices.

Figure 4:
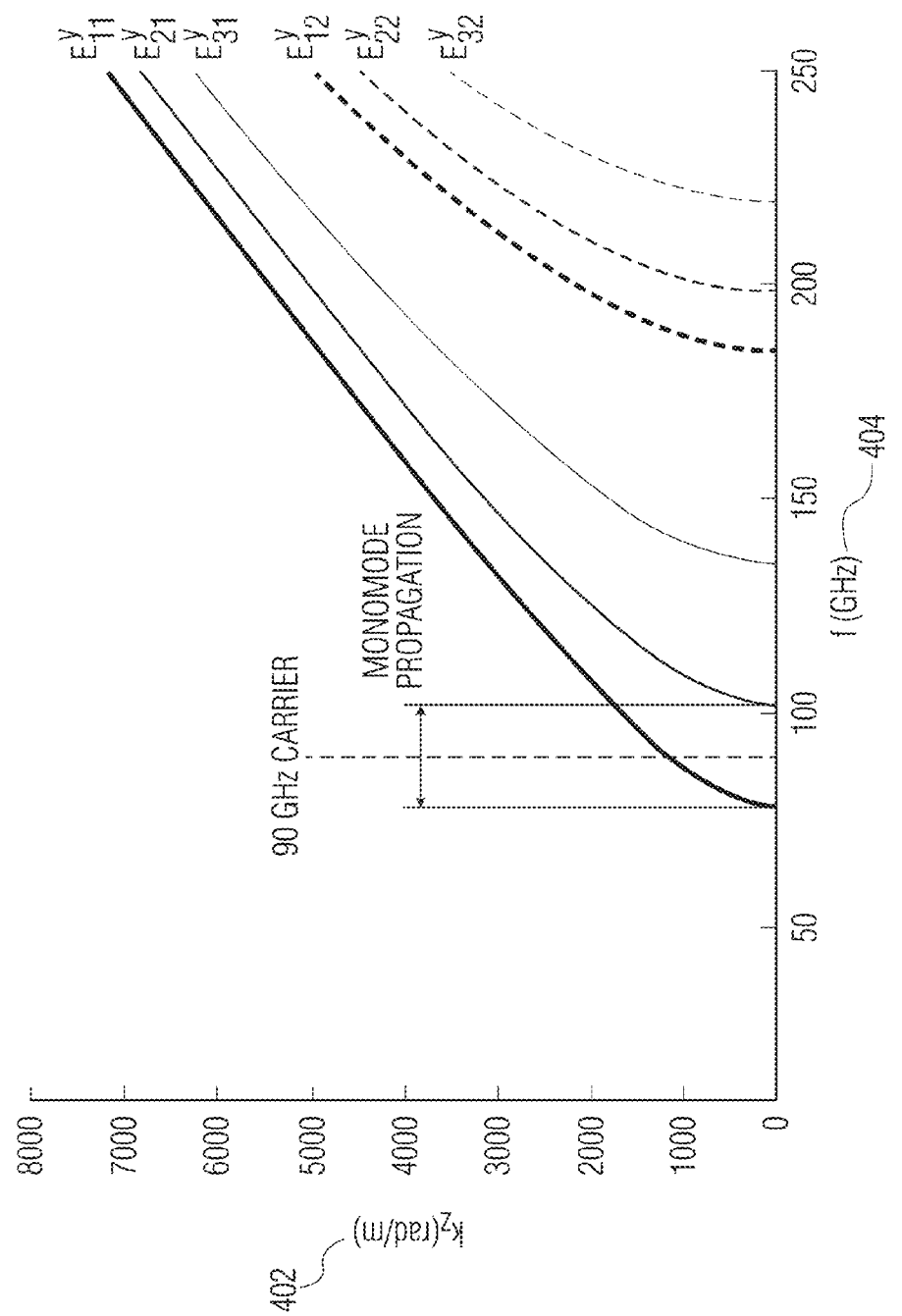
FIG. 4 is a graph comparing a calculated propagation constant for an example matched transmission line interconnect versus frequency.

FIG. 4 is a graph comparing a calculated propagation constant 402 for an example matched transmission line interconnect 100 versus frequency 404. In this example, the transmission line 302 is a 10 mm plastic waveguide made from polypropylene having a cross-section of 2.2 mm (width) by 0.9 mm (height). The transmission line interconnect 100 is formed within an eWLB package. The propagation constant is calculated using the Marcatili's formula. In the frequency band between 78 and 102 GHz only one mode can propagate.

Figure 5:
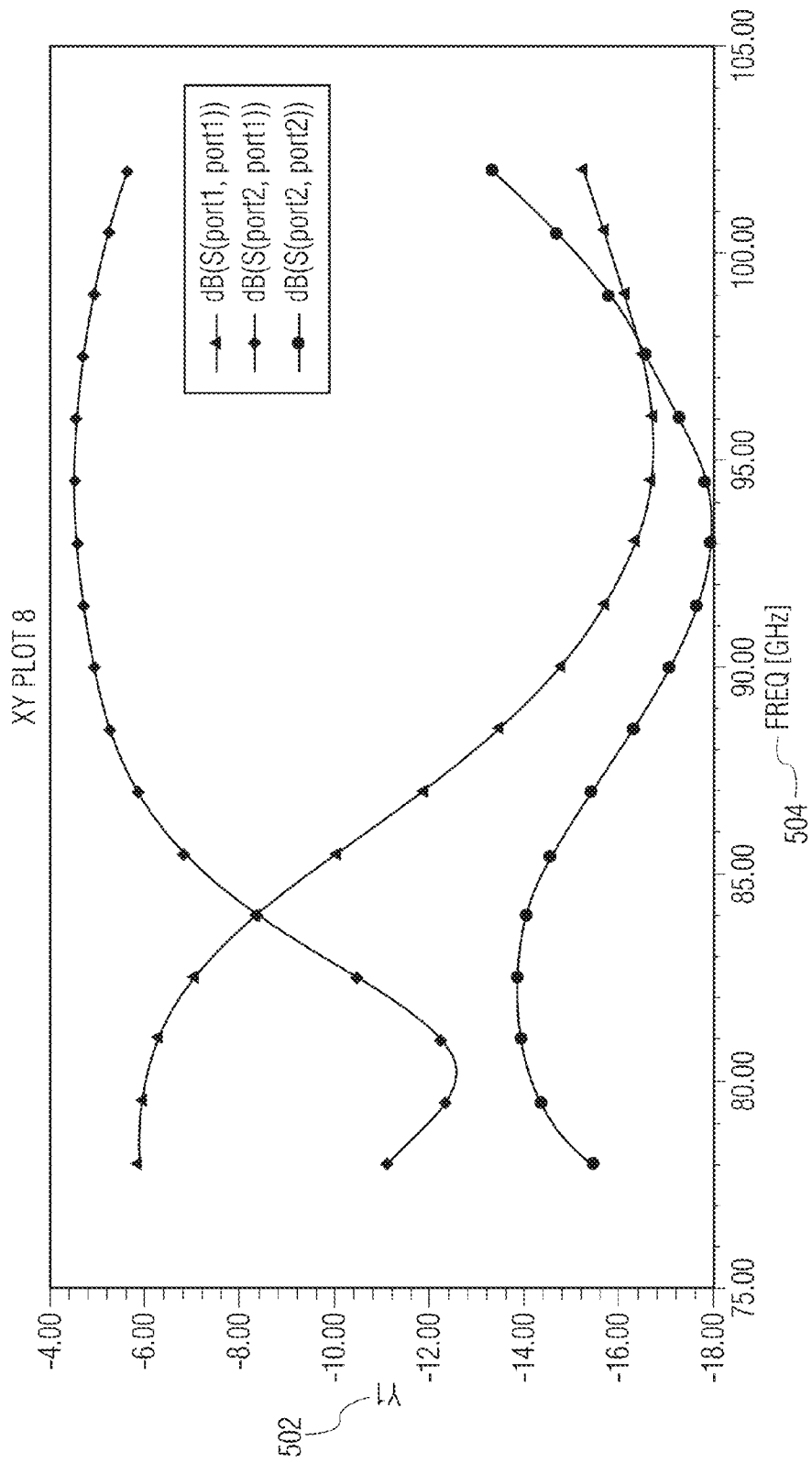
FIG. 5 is a graph comparing a set of S-parameters of the example matched transmission line interconnect versus frequency.

FIG. 5 is a graph comparing a set of S-parameters 502 of the example matched transmission line interconnect versus frequency 504. S-parameters for an eWLB plastic waveguide interface with 10 mm plastic waveguide in the frequency range between 78 and 102 GHz are shown. Port 1 corresponds to the port connected to a dipole antenna and port 2 corresponds to a plastic waveguide port. S11 is below −10 dB above 86 GHz and the S21 is around −4 dB at 95 GHz.

Figure 6:
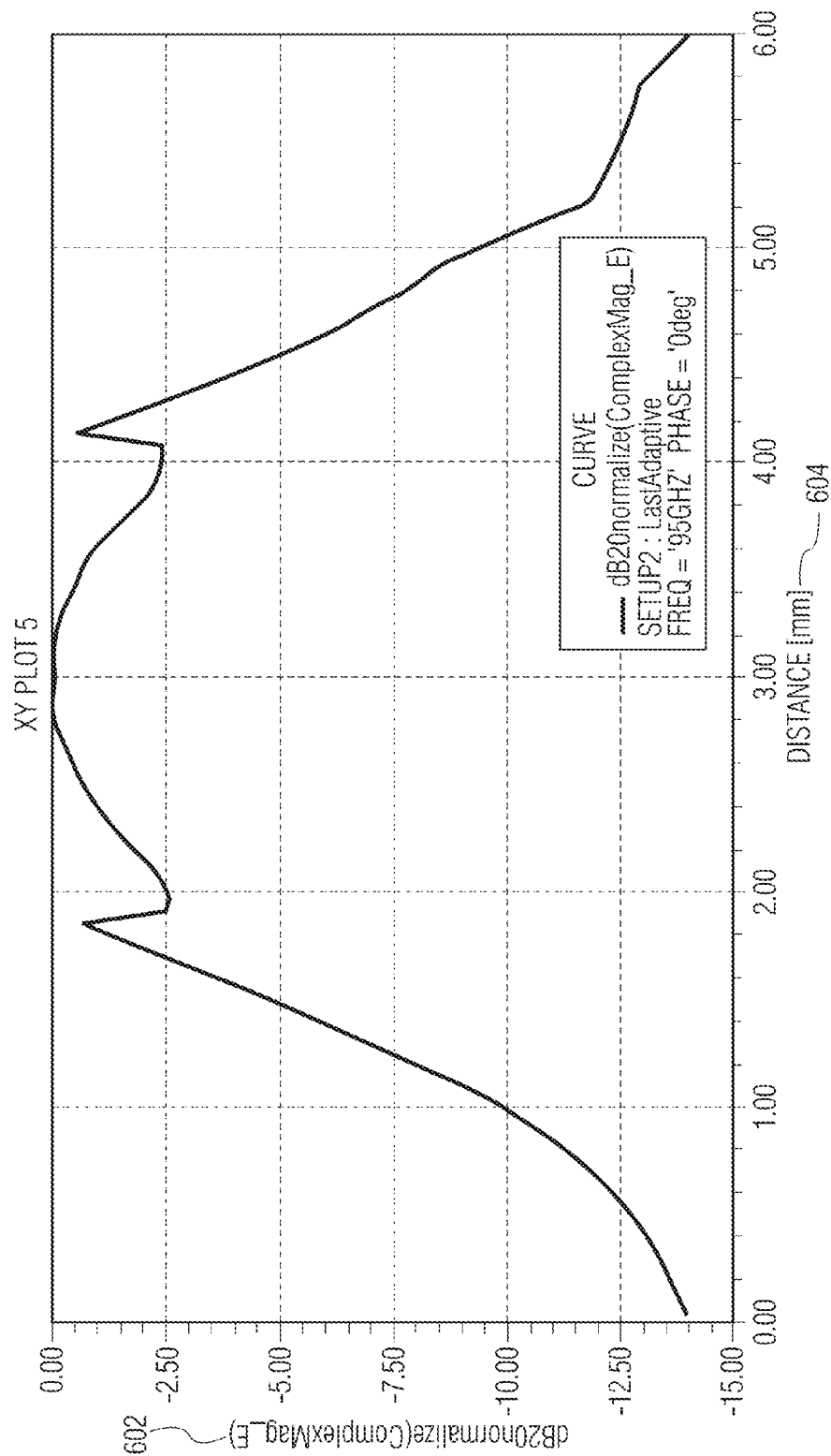
FIG. 6 is a graph comparing electrical field strength of the example matched transmission line interconnect over a width of an example plastic waveguide.

FIG. 6 is a graph comparing electrical field strength 602 of the example matched transmission line interconnect over a width 604 of an example plastic waveguide. The electrical field strength 602 has been normalized in an x-y cross section at 95 GHz. The 3 mm distance corresponds to the center of the example waveguide.

Figure 7:
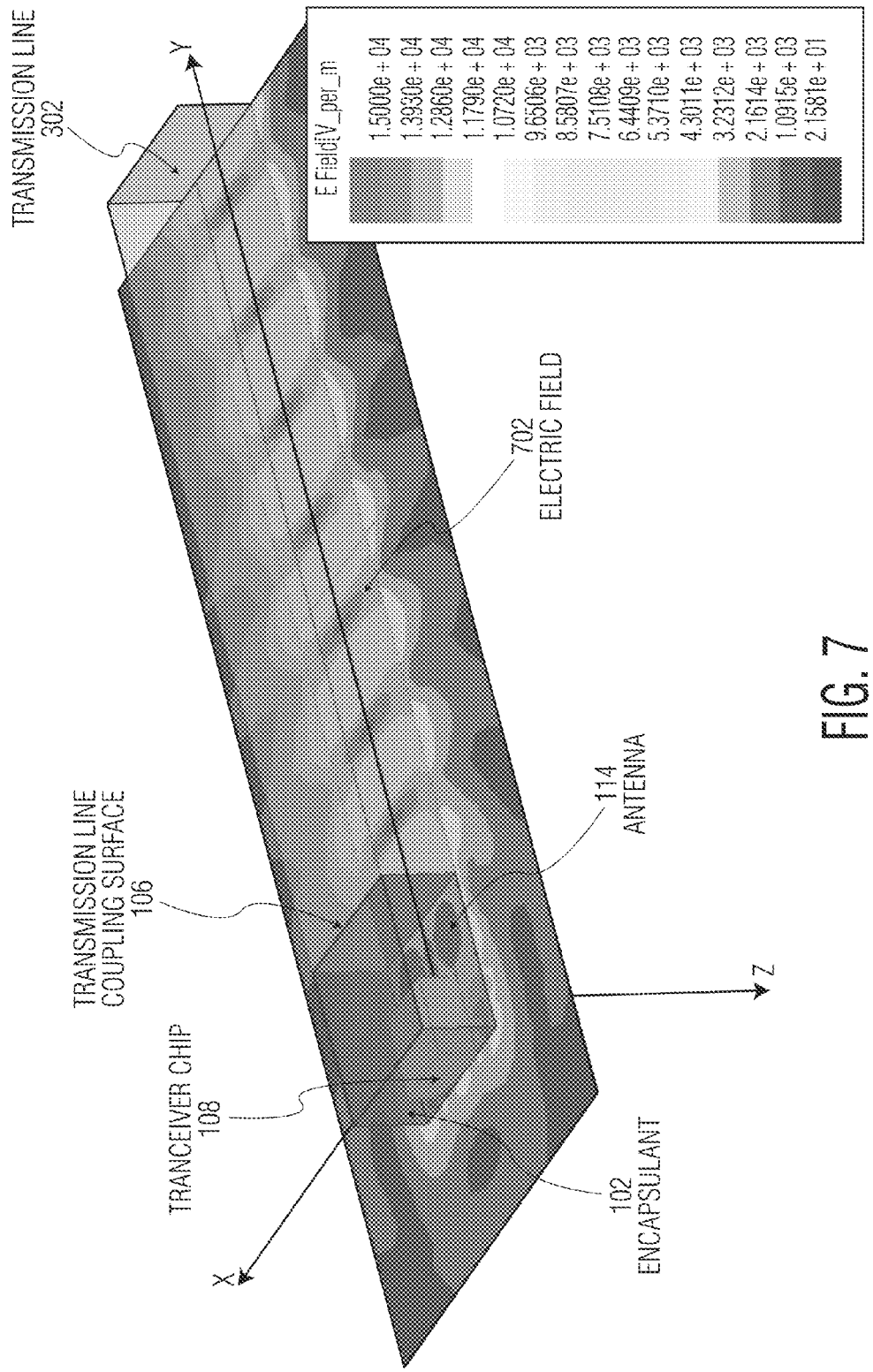
FIG. 7 is another example of a perspective view of a transmission line interconnect coupled to a transmission line.

FIG. 7 is another example of a perspective view of a transmission line interconnect 100 coupled to a transmission line 302. An electric field propagation 702 is shown for an eWLB interconnect package and a plastic waveguide 302. As can be seen the electric field 702 is substantially confined in the plastic waveguide 302.

Figure 8A:
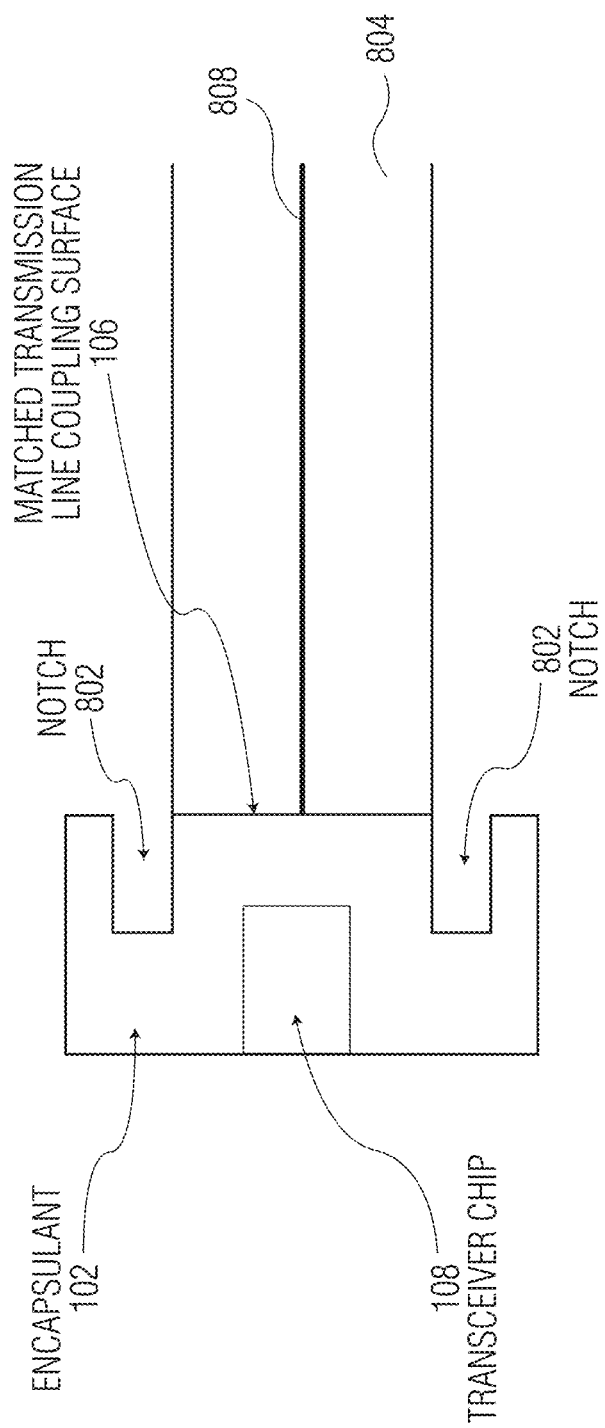
FIG. 8A is one example of a top view of a transmission line interconnect with notches coupled to a transmission line.
Figure 8B:
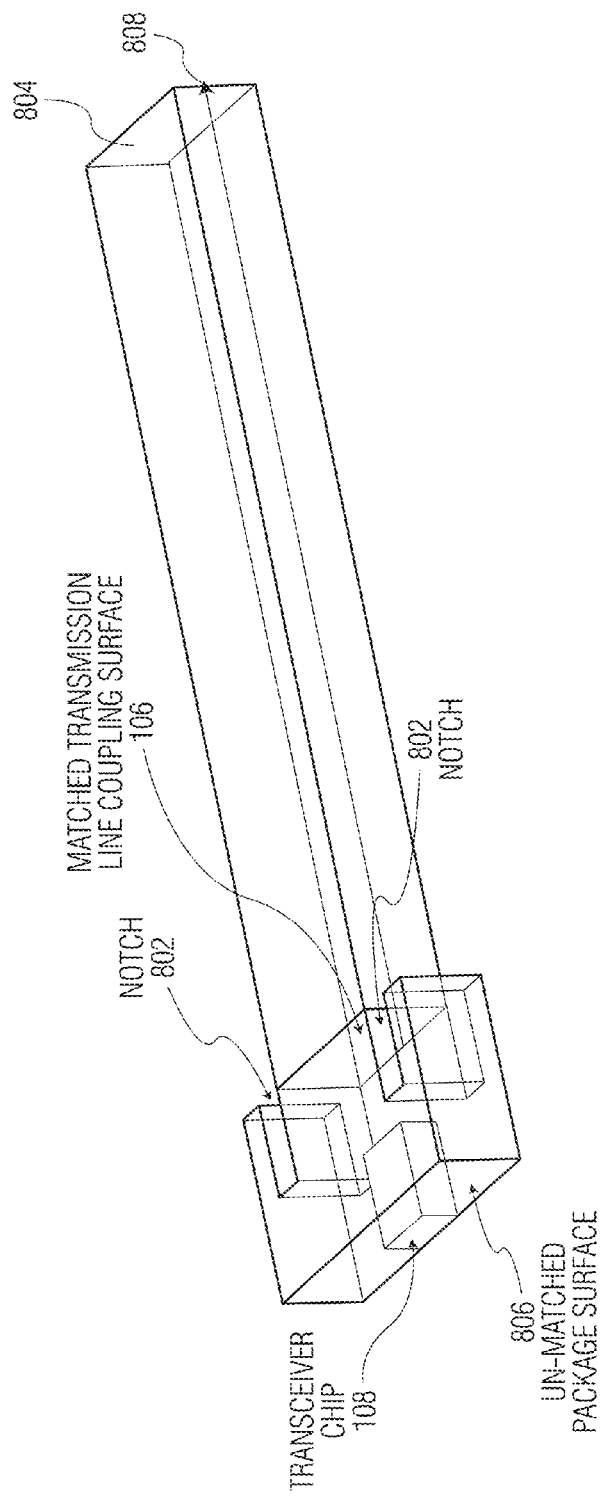
FIG. 8B is one example of a perspective view of a transmission line interconnect with notches coupled to a transmission line as shown in FIG. 8A.

FIG. 8A is one example of a top view of a transmission line interconnect 100 with notches 802 coupled to a transmission line 804. FIG. 8B is one example of a perspective view of the transmission line interconnect 100 with notches 802 coupled to a transmission line 804 shown in FIG. 8A.

In the example shown, the molding compound 102 (i.e. encapsulant) includes a matched transmission line coupling surface 106 and an un-matched package surface 806. The transmission line 804 is coupled to the matched transmission line coupling surface 106 which has been separated from the un-matched package surface 806 by the notches 802.

These notches 802 enable the transmission line coupling surface 106 of the dielectric molding compound 102 to be substantially matched to a cross-sectional area of the transmission line 804. In this example, the cross-sectional area of the transmission line coupling surface 106 is substantially perpendicular to a longitudinal axis 808 of the transmission line 804.

Thus the notches 802 enable an example eWLB interconnect package to have cross-sectional surface dimensions which are larger than the transmission line's 804 (e.g. waveguide) cross-sectional area while still forming a matched transmission line coupling surface 106 where the transmission line 804 is coupled to the molding compound 102. Thus the interconnect package interface with the waveguide can be modified to allow more flexibility of the waveguide interface (e.g. make larger or smaller interconnect area which substantially matches the waveguide cross-sectional dimensions). In one example embodiment the notches 802 are air cavities.

Figure 9:
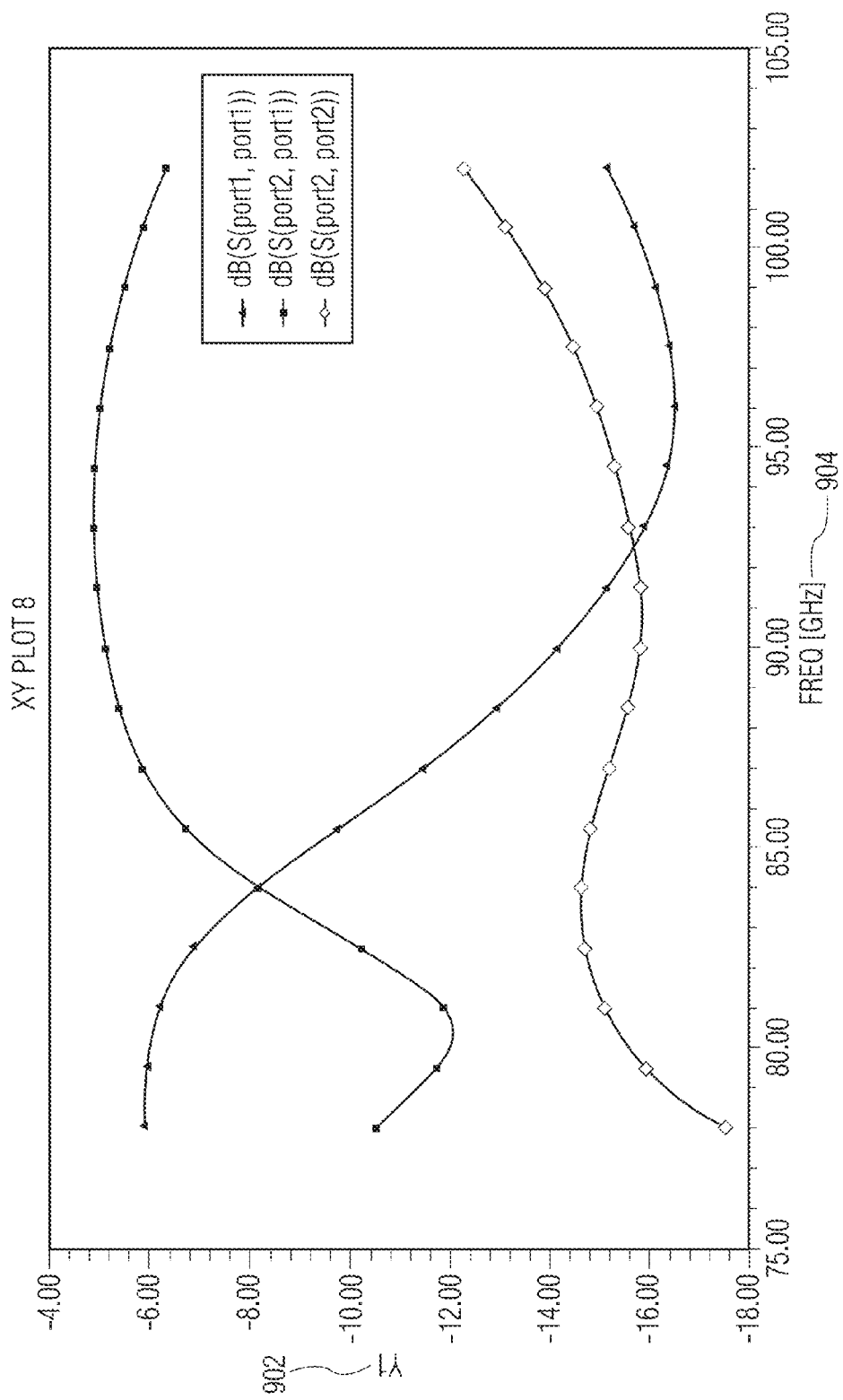
FIG. 9 is a graph comparing a set of S-parameters of an example notched transmission line interconnect versus frequency.

FIG. 9 is a graph comparing a set of S-parameters 902 of an example notched transmission line interconnect versus frequency 904 for a waveguide, such as discussed in FIG. 5.

Figure 10:
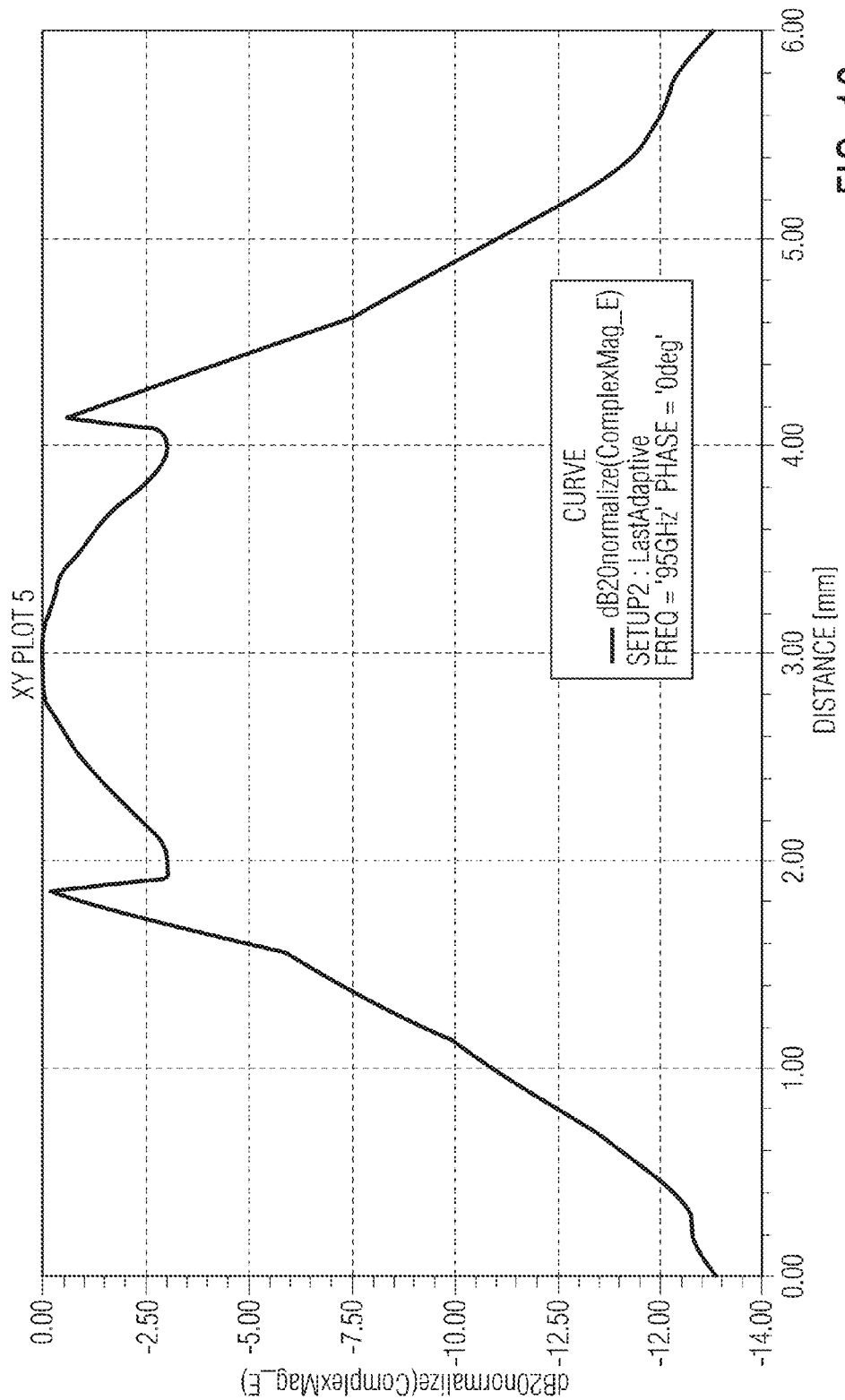
FIG. 10 is a graph comparing electrical field strength of the example notched transmission line interconnect over a width of an example plastic waveguide.

FIG. 10 is a graph comparing electrical field strength of the example notched transmission line interconnect over a width of an example plastic waveguide, such as discussed in FIG. 6. The simulated results shown in FIG. 9, and FIG. 10 are almost equal to the results of the matched interconnect package without notches. Thus the notches 802 provide an option for connecting interconnect packages that have a different overall cross-sectional areas compared to the waveguide's cross-sectional area.

Figure 11:
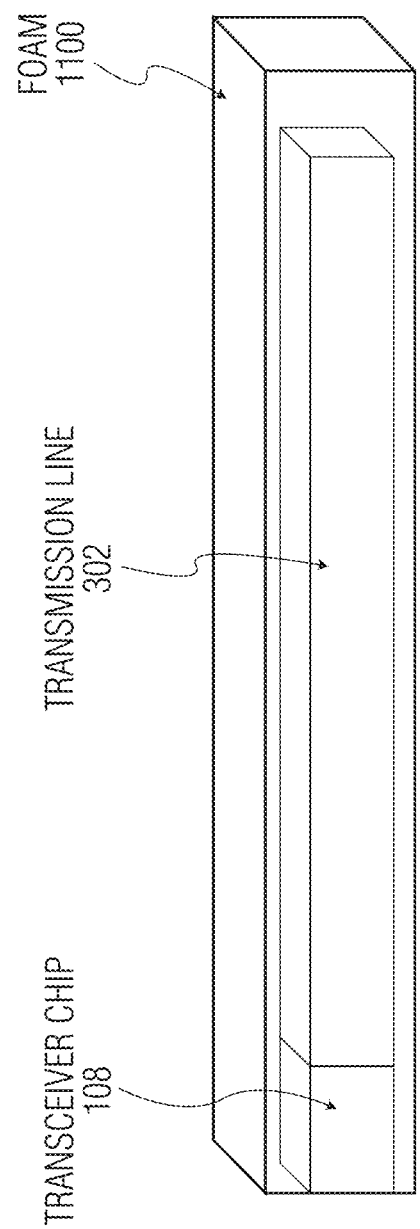
FIG. 11 is one example of a perspective view of a transmission line interconnect coupled to a transmission line within a foam.

FIG. 11 is one example of a perspective view of a transmission line interconnect 100 coupled to a transmission line 302 within a foam 1100. The foam 1100 shields the FIG. 11 assembly from selected effects of surrounding electrical and mechanical components (not shown).

Figure 12B:
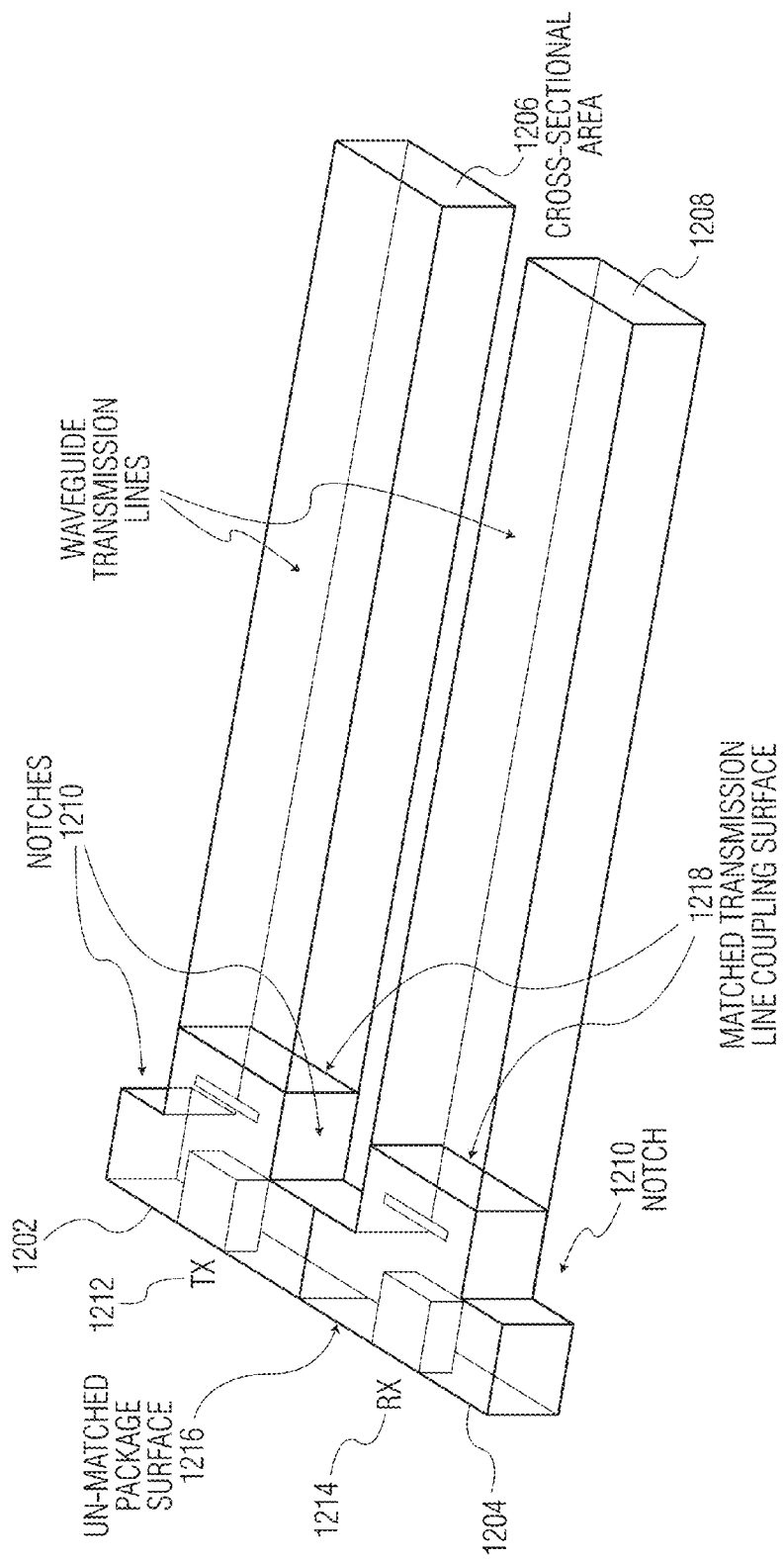
FIG. 12B is one example of a perspective view of the set of transmission line interconnects coupled to the transmission lines and including the first set of notches as shown in FIG. 12A.

FIG. 12A is one example of a top view of a set of transmission line interconnects 1202 and 1204 coupled to transmission lines 1206 and 1208 and including a first set of notches 1210. FIG. 12B is one example of a perspective view of the set of transmission line interconnects 1202 and 1204 coupled to the transmission lines 1206 and 1208 and including the first set of notches 1210 as shown in FIG. 12A.

In this example embodiment, the two waveguides 1206 and 1208 are integrated in a same eWLB interconnect package with a transmitter (TX) chip 1212 and a receiver (RX) chip 1214. As shown, the eWLB package has an un-matched package surface 1216 and a matched transmission line coupling surface 1218.

Figure 13B:
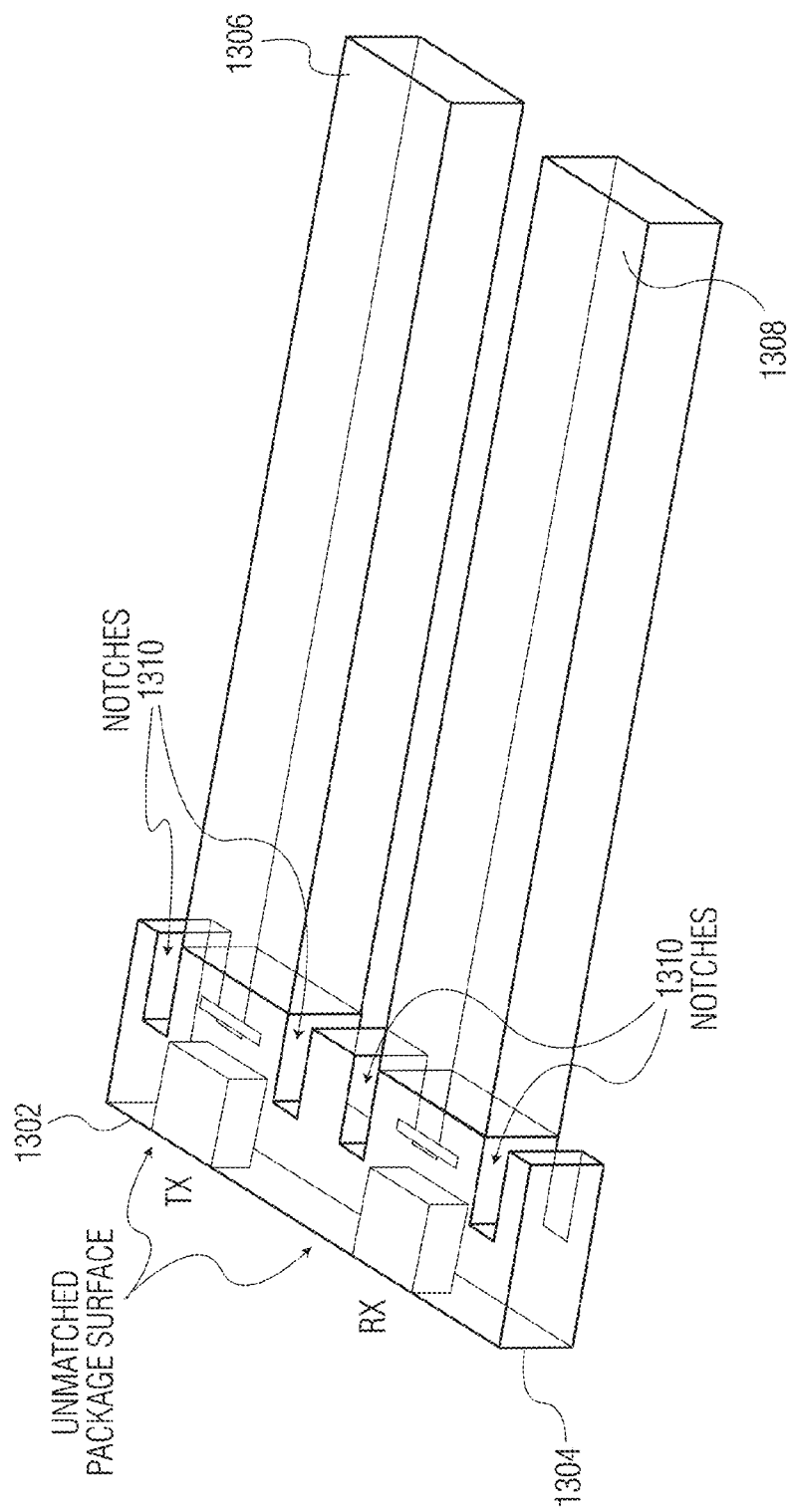
FIG. 13B is one example of a perspective view of the set of transmission line interconnects coupled to the transmission lines and including the second set of notches as shown in FIG. 13A.

FIG. 13A is one example of a top view of a set of transmission line interconnects 1302 and 1304 coupled to transmission lines 1306 and 1308 and including a second set of notches 1310. FIG. 13B is one example of a perspective view of a set of transmission line interconnects 1302 and 1304 coupled to transmission lines 1306 and 1308 and including the second set of notches 1310 shown in FIG. 13A.

This example embodiment is similar to that of FIGS. 12A and 12B, however the notches 1310 are of a different configuration.

Figure 14:
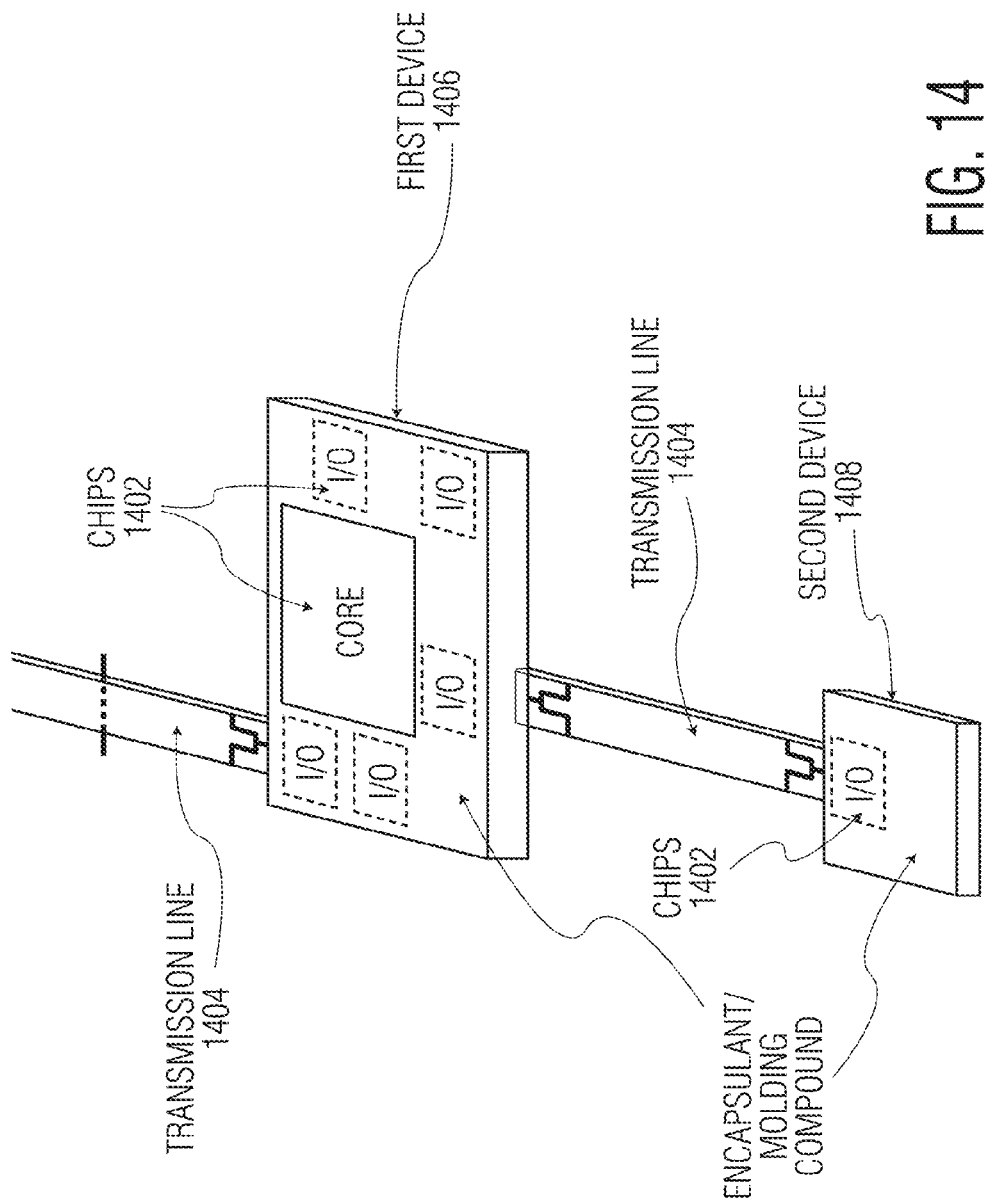
FIG. 14 is one example of a perspective view of a set of encapsulated chips connected to a set of transmission line interconnects and a set of transmission lines.

FIG. 14 is one example of a perspective view of a set of encapsulated chips 1402 connected to a set of transmission line interconnects 100 and a set of transmission lines 1404. In this example the transmission line interconnects 100 are used for chip-to-chip interconnects between a first device 1406 and a second device 1408, and for board-to-board interconnects between the first device 1406 and another PCB board (not shown). Thus the transmission line interconnects 100 can be used to form versatile multi-modality serial links.

Figure 15:
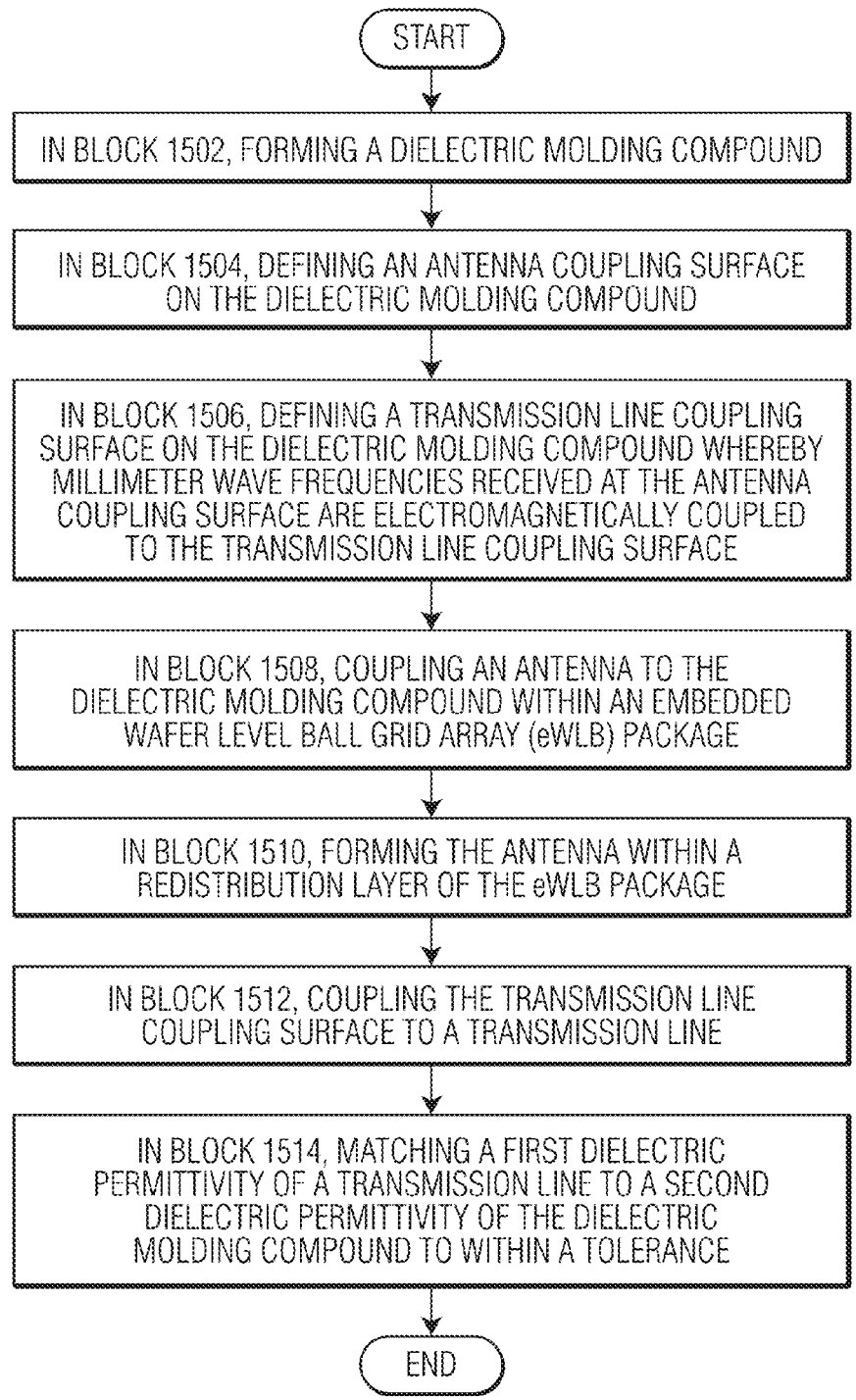
FIG. 15 is one example of a flowchart for manufacturing a transmission line interconnect.

FIG. 15 is one example of a flowchart for manufacturing a transmission line interconnect. The method 1500 begins in block 1502, by forming a dielectric molding compound. Next in block 1504, defining an antenna coupling surface on the dielectric molding compound. Then in block 1506, defining a transmission line coupling surface on the dielectric molding compound whereby millimeter wave frequencies received at the antenna coupling surface are electromagnetically coupled to the transmission line coupling surface.

Other example embodiments include, block 1508, coupling an antenna to the dielectric molding compound within an embedded Wafer Level Ball Grid Array (eWLB) package. Block 1510, forming the antenna within a redistribution layer of the eWLB package. Block 1512, coupling the transmission line coupling surface to a transmission line. And block 1514, matching a first dielectric permittivity of a transmission line to a second dielectric permittivity of the dielectric molding compound to within a tolerance.

The blocks comprising the flowcharts in the above Figures can be executed in any order, unless a specific order is explicitly stated. Also, those skilled in the art will recognize that while one example method embodiment is now discussed, the material in this specification can be combined in a variety of ways to yield other examples as well. The method next discussed is to be understood within a context provided by this and other portions of this detailed description.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more blocks or steps discussed herein are automated. In other words, apparatus, systems, and methods occur automatically. The terms automated or automatically (and like variations thereof) mean controlled operation of an apparatus, system, and/or process using computers and/or mechanical/electrical devices without the necessity of human intervention, observation, effort and/or decision.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A transmission line interconnect, comprising:
an antenna coupling surface;
a transmission line coupling surface;

a dielectric molding compound electromagnetically coupling the antenna coupling surface to the transmission line coupling surface; and a redistribution layer coupled to an antenna and including conductors which are configured and arranged to route electrical contact points on a transceiver chip to a set of solder bumps, wherein the antenna coupling surface is coupled to the redistribution layer.

2. The interconnect of claim 1, wherein the transmission line coupling surface is a waveguide coupling surface.

3. The interconnect of claim 1, wherein the transmission line interconnect is coupled to receive and transmit a millimeter wave frequency.

4. The interconnect of claim 1,
further comprising a transmission line; and
wherein the transmission line coupling surface is abutted to the transmission line directly or indirectly through an adhesive material, and the dielectric molding compound includes the antenna coupling surface along one plane of the dielectric molding compound and transmission line coupling surface along a different plane of the dielectric molding compound.

5. The interconnect of claim 4, wherein the transmission line is a plastic waveguide.

6. The interconnect of claim 4, wherein the transmission line has a first dielectric permittivity and the dielectric molding compound has a second dielectric permittivity which matches the first dielectric permittivity.

7. The interconnect of claim 1, wherein the redistribution layer includes the conductors configured and arranged to route electrical contact points on a transceiver chip to the set of solder bumps, and wherein the transmission line coupling surface is abutted to the transmission line directly or indirectly through an adhesive material, and the dielectric molding compound includes the antenna coupling surface along one plane of the dielectric molding compound and transmission line coupling surface along a different plane of the dielectric molding compound.

8. The interconnect of claim 1,
further comprising a transceiver chip coupled to the antenna; and
wherein transmission line interconnect is packaged within an embedded Wafer Level Ball Grid Array (eWLB).

9. The interconnect of claim 1,
further comprising a transceiver chip coupled to the antenna; and
wherein transmission line interconnect is packaged within a USB cable.

10. The interconnect of claim 1, wherein the transmission line coupling surface includes a cross-sectional area substantially matching a transmission line cross-sectional area.

11. The interconnect of claim 10, wherein the cross-sectional area of the transmission line coupling surface is substantially perpendicular to a longitudinal axis of the transmission line.

12. The interconnect of claim 10,
further comprising a notch; and
wherein the dielectric molding compound includes a cross-sectional area substantially perpendicular to a longitudinal axis of the transmission line, and includes the cross-sectional area of the transmission line coupling surface; and
wherein the cross-sectional area of the transmission line coupling surface is separated from the cross-sectional area of the dielectric molding compound by the notch.

13. A method of manufacture, for a transmission line interconnect, comprising:
forming a dielectric molding compound;
defining an antenna coupling surface on the dielectric molding compound;
defining a transmission line coupling surface on the dielectric molding compound whereby millimeter wave frequencies received at the antenna coupling surface are electromagnetically coupled to the transmission line coupling surface; and
coupling an antenna to the dielectric molding compound within an embedded Wafer Level Ball Grid Array (eWLB) package.

14. The method of claim 13, further comprising:
forming the antenna within a redistribution layer of the eWLB package.

15. The method of claim 13, further comprising:
coupling the transmission line coupling surface to a transmission line.

16. The method of claim 13, wherein forming the dielectric molding compound includes:
matching a first dielectric permittivity of a transmission line to a second dielectric permittivity of the dielectric molding compound to within a tolerance.

17. A method of manufacture, for a transmission line interconnect, comprising:
forming a dielectric molding compound;
defining an antenna coupling surface on the dielectric molding compound;
defining a transmission line coupling surface on the dielectric molding compound whereby millimeter wave frequencies received at the antenna coupling surface are electromagnetically coupled to the transmission line coupling surface; and
forming a redistribution layer including conductors which are configured and arranged to route electrical contact points on a transceiver chip to a set of solder bumps.

18. The method of claim 17, wherein the transmission line coupling surface is abutted to the transmission line directly or indirectly through an adhesive material, and the dielectric molding compound includes the antenna coupling surface along one plane of the dielectric molding compound and transmission line coupling surface along a different plane of the dielectric molding compound.

* * * * *